United States Patent [19]

Frank

[11] Patent Number: 5,277,750
[45] Date of Patent: Jan. 11, 1994

[54] METHOD FOR ANISOTROPIC DRY ETCHING OF METALLIZATION LAYERS, CONTAINING ALUMINUM OR ALUMINUM ALLOYS, IN INTEGRATED SEMICONDUCTOR CIRCUITS

[75] Inventor: Wolfgang Frank, Unterföhring, Fed. Rep. of Germany

[73] Assignee: Siemens Aktiengesellschaft, Munich, Fed. Rep. of Germany

[21] Appl. No.: 847,779

[22] Filed: Mar. 5, 1992

[30] Foreign Application Priority Data

Mar. 5, 1991 [DE] Fed. Rep. of Germany ....... 4107006

[51] Int. Cl.$^5$ ............................................. H01L 21/00
[52] U.S. Cl. ..................................... 156/643; 156/646; 156/656; 156/665; 204/192.25; 204/192.32
[58] Field of Search ............... 156/643, 646, 664, 665, 156/656; 204/192.25, 192.32

[56] References Cited

U.S. PATENT DOCUMENTS

| | | | |
|---|---|---|---|
| 3,994,793 | 11/1976 | Harvilchuck et al. | 204/192.25 |
| 4,256,534 | 3/1981 | Levinstein et al. | 156/643 |
| 4,351,696 | 9/1982 | Radigan | 156/643 |
| 4,468,284 | 8/1984 | Nelson | 156/643 |
| 4,708,766 | 11/1987 | Hynecek | 156/643 |

FOREIGN PATENT DOCUMENTS 0272143  6/1988  European Pat. Off. .
4-72725  3/1992  Japan .

OTHER PUBLICATIONS

D. Widman et al., "Technologie hochintegrierter Schaltungen", Springer Verlag, 1988, Berlin, Par. 5.2.3, 5.2.5, 5.3.6.

D. Bollinger et al., "Reactive Ion Etching: Its Basis and Future", Solid State Technology, May 1984, pp. 111-117.

S. J. Fonash, "Advances in Dry Etching Processes–A Review", Solid State Technology, Jan. 1985, pp. 150-158.

Ibbotson et al., "Plasmaless dry etching of silicon with fluorine-containing compounds", J. Appl. Phys. 56(10), Nov. 15, 1984, pp. 2939-2942.

L. Colombo et al., "Plasma Etching of Aluminum Alloys for Submicron Technologies", Solid State Tech., Feb. 1990, pp. 95-100.

*Primary Examiner*—Thi Dang
*Attorney, Agent, or Firm*—Herbert L. Lerner; Laurence A. Greenberg

[57] ABSTRACT

A method for anisotropic dry etching of metallization layers containing aluminum or aluminum alloys, in integrated semiconductor circuits, using an etching mask. Etching is performed with a strictly anisotropically attacking etching gas mixture containing an iodine compound being volatile under normal conditions, wherein an accurately defined vertical profile of the conduction lines is formed.

13 Claims, 1 Drawing Sheet

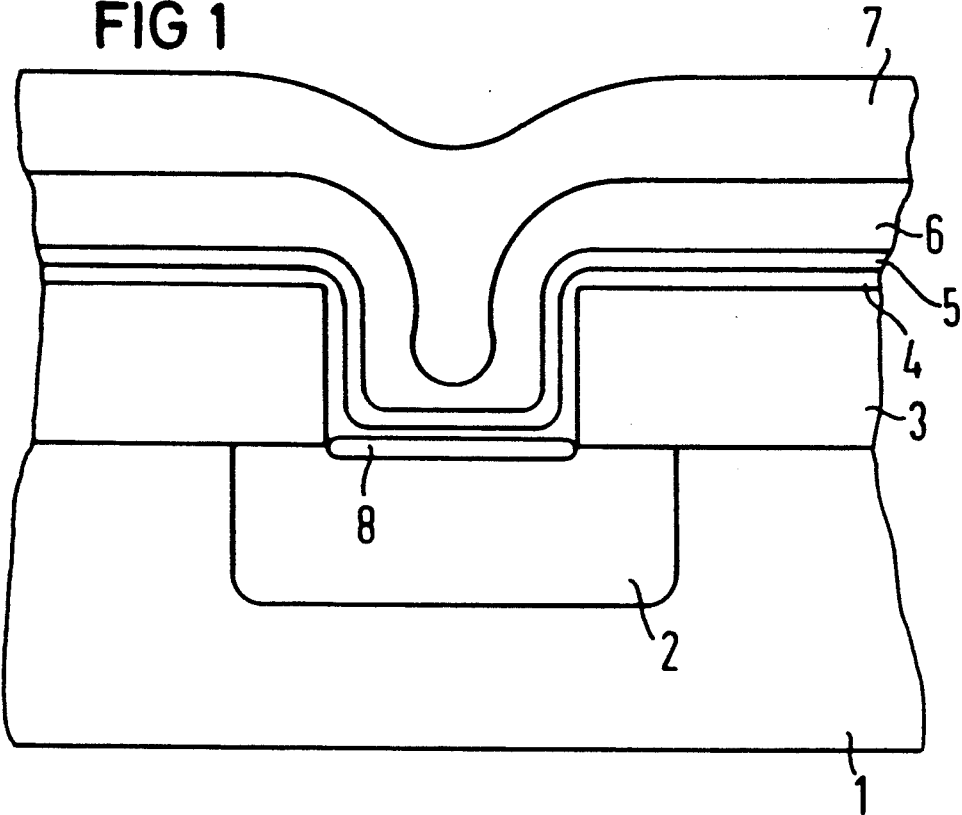
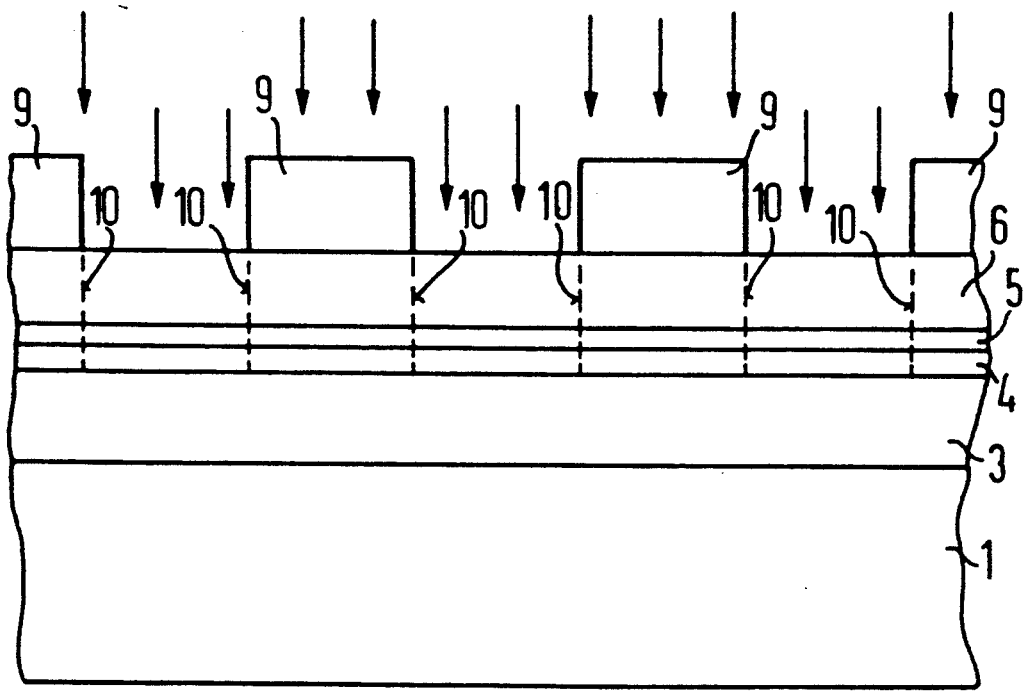

METHOD FOR ANISOTROPIC DRY ETCHING OF METALLIZATION LAYERS, CONTAINING ALUMINUM OR ALUMINUM ALLOYS, IN INTEGRATED SEMICONDUCTOR CIRCUITS

The invention relates to a method for anisotropic dry etching of metallization layers containing aluminum or aluminum alloys, in integrated semiconductor circuits, in which an etching mask is used, especially without sidewall passivation and without corrosion, and in particular in the submicron range.

With regard to the state of the art in etching, reference is made to chapter 5 of the book entitled "Technologie hochintegrierter Schaltungen" [Large-Scale Integrated Circuit Technology] by D. Widmann, H. Mader and H. Friedrich published in 1988, and particularly sections 5.2.3, 5.2.5, and 5.3.6 thereof.

Due to their superior material properties (low resistance, low contact resistance, good adhesion of overlying dielectrics, self-passivation capability by forming a native oxide film, suitability for multilayer metallization) and a high-quality deposition technology with good step coverage, aluminum and aluminum alloy layers have been used as metallization material from the beginning of VLSI technology. Aluminum layers with a thickness in the range of approximately 1 to 2 μm, optionally alloyed with small quantities of silicon and copper, for instance, are usually produced by sputtering. Currently, multilayer metallization is often used, having an Al/TiN/Ti structure. Optionally, a $SiO_2$ layers above the multilayer may be applied which is used as an isolation layer with respect to other metallization levels located above. In order to produce fine structures of the aluminum metallization layer in the course of the production of integrated circuits, plasma assisted etching processes (dry etching) are practically used. In such processes, a structured layer, for instance of photoresist, is already placed as an etching mask upon the aluminum layer to be structured. In principle, the object is to transfer the pattern of the etching mask to the underlying layer (the aluminum metallization) as dimensionally accurately as possible. Generally, the etching should be carried out selectively to the following layer, or in other words the underlaying layer should be attached.

One method for a dry etching process is plasma-assisted chemical etching, in a conventional barrel reactor, for instance (see the book by Widmann et al beginning at page 194). Gases that are primarily compounds containing fluorine, chlorine, and bromine, which form a gaseous, volatile reaction product with the material of the layer to be removed, are used as an etchant. In the etching reactor, a plasma is generated by a gas discharge. Consequently, neutral reactive particles (radicals) created in the plasma diffuse into the substrate wafers located in the reactor, and in many cases react spontaneously and exothermically with the atoms of the surface to be etched. The reaction product subsequently diffuses away from the wafer. Since the direction of motion of the neutral particles in chemical etching is generally distributed isotropically, the etching attack is isotropic and therefore causes underetching of the etching mask, or in other words an isotropic etching profile. Purely chemical etching processes are therefore unsuited to generating very fine structures.

In order to produce very fine structures, various plasma-assisted physical-chemical etching processes are currently used, such as reactive ion etching (RIE), magnetically enhanced reactive ion etching (MERIE), or electron cyclotron resonance (ECR). In order to keep the isotropic etching component small and to attain a more or less anisotropic etching profile, such etching processes make use of additional physical aids. In reactive ion etching (RIE), the chemical etching reaction should be initiated only by ions produced in the plasma which impinge at right angles to the etching surface. The thus-created perpendicular anisotropic etching component does in principle open up the possibility of anisotropic etching. However, the actual etching on a number of factors and is almost always affected by an isotropic etching component, which the various aids (such as magnetic field enhancement or a low operating pressure range) cannot eliminate completely in most cases.

The selection of the compound being used as an etching gas and leading to a volatile reaction product, and of the special reactor type and special process conditions, is made in the pursuit to the definitive aspects of the etching process or etching result for the particular application (among them being the etching profile, etching rate, selectivity, scavenging properties, polymer formation, volatility and reactivity of the reaction product, damage to the crystalline lattice structure, and corrosion). The result of the etching process is determined primarily by the interaction of the two components, that is the etching gas composition and the material to be etched. For many variations of silicon layers and metal layers used in the semiconductor industry, highly variable empirical values have been obtained for the various systems of layers and etching gas.

As noted, the formation of a gaseous, volatile reaction product is a necessary precondition of the chemical etching reaction. In the etching of aluminum, the use of the halogens chlorine and bromine is state of the art. For the chlorine or bromine donors, a number of compounds, each with their specific advantages and disadvantages, are known. Fluorine is not suitable for the etching of aluminum, because it does not form a volatile reaction product until a very high temperature is attained. In order to exploit the specific advantages of various gases, an etching gas mixture is utilized most currently used etching processes. Mixtures of $CCl_4/Cl_2$, $BCl_3/Cl_2$, $SiCl_4Cl_2$, $SiCl_4/BCl_3/Cl_2$, $BCl_3/CHCl_3/Cl_2$ with $N_2$ and He additives $BCl_3/Cl_2/CH_4$, and $BBr_3/HBr$, for instance, are common.

The gases $CCl_4$, $CHCl_3$, $SiCl_4$ as well as hydrogen chloride and hydrogen bromide are suitable more for an anisotropic etching profile, while molecular chlorine or bromine each etch purely isotropically. Etching gases containing bromine, in contrast to those containing chlorine, have the advantage of improved photoresist selectivity.

Aluminum etching processes based on iodine chemistry have not been known previously. The economical use of molecular iodine ($I_2$) as an etching gas in a practical manner must be rejected at the outset, because iodine is a solid at room temperature and does not have a vapor pressure of approximately 50,000 Pa, which is a precondition for adequate gas flow, until it attains 150° C. Thus, the entire gas path (more than 10 m in length) together with the iodine tank and the etching chamber must be heated to 150° C., which is not at all feasible technically, or at least it is only feasible at very major effort and expense. Such a high temperature is also problematic because the photoresist (etching mask)

must normally not be heated exceeding approximately 120° C. Moreover, since to our knowledge only very few iodine compounds that are volatile under normal conditions are known, namely hydrogen iodide and problematic interhalogens, such as $IF_7$, etching chemistry based on iodine seems not promising. Accordingly, the use of hydrogen iodide as an etching gas has been proposed in recent years only for the sake of reactive ion etching of silicon layers and tin layers on semiconductor substrates.

Published European Application No. 0 272 143 A2 describes etching of silicon and silicides by means of bromine and iodine chemistry by the MERIE process. In the pursuit to produce trenches in the ULSI range, the authors seek an etching process that is distinguished by optimization of the etching rate, selectivity with respect to the mask, and the aspect ratio. Moreover, they seek to prevent black silicon formation, in which contamination with local residual oxides creates undesirable micromasks, under which inadequate etching takes place. The European application therefore proposes giving up the special chlorine chemistry previously used for silicon layers, because chlorine gases etch strictly anisotropic and, thus are not able to underetch the micromasks as desired in this case. In combination with polysilicon-silicide double layers, it is also stated that with the newly proposed chemistry, the aforementioned properties of the etching process can be optimized, while on the other hand an adequate anisotropy can already be assured by the previously known chlorine-containing component of the etching composition. According to U.S. Pat. No. 4,708,766, hydrogen iodide is used for RIE of tin layers, precisely because of its especially isotropic etching properties. Aluminum, among others, is mentioned as a material for an etching mask that is resistant to hydrogen iodide.

In order to transfer extremely small structures (new structures in ULSI technology aim at structure dimensions in the submicron range), perfect anisotropy must be demanded of an etching process (f=1; see the book by Widmann et al at page 189). Since purely physical etching processes (sputter etching), which generally have a non-vertical profile with a pronounced taper, must be rejected, and physical-chemical processes always features an isotropic etching component, additional provisions have to be made in order to attain a genuinely strictly anisotropic etching profile. In order to attain the desired perfect anisotropy, it is state of the art (for example, see the article by D. Bollinger et al, entitled "Reactive Ion Etching: Its Basis and Future", in Solid State Technology, May 1984, pages 111-117) to coat the profile that has just been etched with a passivation layer that protects against the attack of the etching gas (such as $CCl_4$). The passivation layer is formed of polymer products of either the etching gas itself or halocarbons admixed with the etching gas mixture for that purpose. The passivation layers, which is formed at right angles to the direction of incidence of the impinging ions over the regions of the aluminum layer to be etched, are physically removed again immediately by the ions, so that the etching process proceed unhindered, deep into the material.

However, the passivation layers (sidewall passivation) that are deposited on the vertical aluminum sidewalls and are created in accordance with the etching pattern during the etching, remain undamaged, because they are not attacked by any ions that have sufficiently great energy to ignitiate a reaction. By preventing underetching, the sidewall passivation guarantees a anisotropic etching with a vertical profile of the aluminum structures. The passivation mechanism can be reinforced by reaction products of the photoresist mask with the etching gas.

The previously necessary use of sidewall passivation is extremely problematical, for various reasons. First, the process wafer and the etching chamber are severely contaminated by the polymers. Second, the thickness of the sidewall layer is difficult to control. If the passivation is too thin, the sidewall film rips, and the anisotropy is destroyed by lateral attack of the etchant. The passivation layer must accordingly be kept sufficiently thick to prevent underetching of the aluminum structure by the etching gas. The resultant dimensional gain in the critical structures ("CD gain") of up to 0.2 $\mu m$ is no longer within tolerance for structure dimensions in the submicron range.

Another problem is the incorporation of species containing chlorine or bromine during the deposition of the polymer film. If the substrate wafer is exposed to the ambient after etching, such halogen species react with the ambient moisture forming aluminum(hydr)oxides, and destroy the etching profile in the course of a self-sustaining corrosion reaction. The post treatment steps (such as rinsing with water, in-situ photoresist stripping, heating of the wafer, passivation in fluorine plasma) used to avoid corrosion are time-consuming, expensive, and therefore uneconomical. In many cases, it is nevertheless impossible to attain complete protection against corrosion.

Another aspect of the problems with the etching process is the fact that the etching chemistry must be composed in such a way that the natural aluminum oxide film is well removed by etching, and that the etching gas is capable of binding (scavenging) the residual oxygen and moisture remaining in the chamber, in order to prevent the re-formation of the aluminum oxide film. Finally, another consideration is that in etching with the previously typical chlorine chemistry, the Ti/TiN barrier of a multilayer metallizing layer, while being automatically removed in the main etching step along with the aluminum layer, still entails problems in terms of uniformity of the etching over the etching surface.

It is accordingly an object of the invention to provide a method for anisotropic dry etching of metallization layers containing aluminum or aluminum alloys, in integrated semiconductor circuits, which overcomes the hereinafore-mentioned disadvantages of the heretofore-known methods of this general type and which furnishes a simple, flexible, corrosion-free, perfectly anisotropic and dimensionally stable etching process for applications that are particularly in the submicron range.

With the foregoing and other objects in view, there is provided, in accordance with the invention, a method for anisotropic dry etching of metallization layers containing aluminum or aluminum alloys, in integrated semiconductor circuits, using an etching mask. The improvement comprises etching with a strictly anisotropically attacking etching gas mixture containing an iodine compound being volatile under normal conditions, and forming an accurately defined vertical profile of the conduction lines.

In accordance another mode of the invention, there is provided a method which comprises performing the etching step with an etching gas mixture containing hydrogen iodide. With hydrogen iodide, a volatile iodine compound which is usable according to the invention and which moreover guarantees a high iodine yield, is available.

Although the known thermodynamic data of the reaction of aluminum with iodine to form aluminum iodide ($Al_2I_6$) lead one to expect a spontaneous reaction with an isotropic characteristic, it has been found that in etching with hydrogen iodide it is even possible to renounce of a thin sidewall passivation. As the test results show, the etching performed in accordance with the invention produces a strictly anisotropic etching profile with a vertical sidewall structure, even without additional sidewall passivation. Analysis under the scanning electron microscope also shows no alteration of the structural dimensions. A dimensional gain from any sidewall passivation that might originate in the photoresist must accordingly be below the limit of accurate detection (<30 nm). With an etching process based on the use of hydrogen iodide, an anisotropic and strictly dimensionally stable but also corrosion-free structuring of aluminum and aluminum alloys in the submicron range thus becomes possible, without sidewall passivation.

In accordance with a further mode of the invention, there is provided a method which comprises performing the etching step with an etching gas mixture containing at least one halogen-containing compound in addition to the iodine compound.

In accordance with an added mode of the invention, there is provided a method which comprises performing the etching step with an etching gas mixture additionally containing a substance selected from the group consisting of a simple carbon compound, a simple nitrogen compound and a simple oxygen compound, preferably $N_2O$, $CO$, $CO_2$ or $CH_4$.

In accordance with an additional mode of the invention, there is provided a method which comprises performing the etching step with an etching gas mixture containing a substance selected from the group consisting of nitrogen, oxygen, hydrogen and a noble gas, preferably helium or argon, as a carrier gas.

In accordance with yet another mode of the invention, there is provided a method which comprises forming the conduction lines from an aluminum alloy containing at least one material selected from the group consisting of silicon and copper.

In accordance with yet a further mode of the invention there is provided a method which comprises etching the metallization layer by plasma-assisted reactive ion etching.

In accordance with yet an added mode of the invention, there is provided a method which comprises applying a photoresist layer as the etching mask.

In accordance with yet an additional mode of the invention, there is provided a method which comprises applying a hard mask preferably made of a material selected from the group consisting of $SiO_2$ and $Si_3N_4$, being structured by a photoresist mask, as the etching mask.

In accordance with a concomitant mode of the invention, there is provided a method which comprises forming conduction lines without sidewall passivation and without corrosion, in particular in the submicron range.

Other features which are considered as characteristic for the invention are set forth in the appended claims.

Although the invention is illustrated and described herein as embodied in a method for anisotropic dry etching of metallization layers containing aluminum or aluminum alloys, in integrated semiconductor circuits, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, cross-sectional view of a layer structure of a contact hole level of a silicon semiconductor substrate; and FIG. 2 is a fragmentary, cross-sectional view of aluminum structures to be etched by the method according to the invention.

DETAILED DESCRIPTION OF THE DRAWINGS

Referring now to the figures of the drawing in detail and first, particularly, to FIG. 1 thereof, there is seen a presently typical layer structure of a metallizing level of an aluminum contact of a semiconductor substrate 1. The area that has to be contacted is a tublike region 2 of $p^+$doped or $n^+$doped silicon, which is produced in the undoped substrate 1. An aluminum contact is made in the form of a multilayer metallizing layer:

A lower titanium layer 4 serves to improve contact resistance, by producing a titanium silicide interface 8 as a result of heat treatment.

A middle titanium nitride layer 5 serves as a diffusion barrier to prevent diffusion of aluminum into silicon and vice versa. Otherwise, spikes of considerable magnitude could form and destroy the contact. The use of titanium or titanium nitride layers as a diffusion barrier in aluminum metallization is known from Published European Patent Application No. 0 304 728.

An upper aluminum-silicon-copper layer 6 serves as a metallization layer, for carrying current. The silicon admixture is intended to prevent the dissolution of the substrate silicon into aluminum. The copper ligand serves to improve the electromigration properties. Other ligands are also possible.

An $SiO_2$ layer 7 which is also applied above the multilayer metallization layer serves as an isolation layer with respect to the metallization layers located above, and for the sake of planarization. An isolation oxide 3, such as boron phosphorous silicate glass, is located between the metallization layer and the substrate 1.

FIG. 2 diagrammatically shows a transfer of a mask pattern of an etching mask 9, which in this case is a photoresist, onto the multilayer metallizing layer. In FIG. 2, identical reference numerals have the same meaning as in FIG. 1. However, a hard mask, preferably of $SiO_2$ or $Si_3N_4$, which is structured by means of a photoresistant mask, may also be used as the etching mask 9. Arrows in FIG. 1 are meant to indicate ions arriving from above, and dashed lines are meant to indicate the proceeding of the etching. In the etching according to the invention with an etching gas mixture containing hydrogen iodide, a strictly anisotropic etching attack occurs without any lateral etching component, so that without a protective but disadvantageous sidewall passivation, an accurately defined vertical profile 10 of the conduction lines is built up from the multilayer metallization layer is formed. Since hydrogen iodide has a sufficiently high vapor pressure under normal conditions, the etching process according to the invention can be performed without additional heating provisions. The strict anisotropy of the method according to the invention is not primarily due to the physical etching component, so that the method can easily be carried out with a standard RIE dry etcher (Tylan/-Tokuda HIRRIE 100). Using another RIE model or a more-complicated and expensive reactor of the MERIE or ECR type is also possible. However,. since the physical component does not primarily determine the anisotropy, it is possible to keep the energy of the arriving ions low, which lessens the danger of burning of the photoresist mask from the kinetic energy transferred by ion bombardment. Structuring of the multilayer metallizing can, for instance, be performed with a deep-UV-hardened photoresist mask.

In tests, the following typical main process parameters were set:
process pressure: 1 to 150 Pa
HI flow: 5 to 1000 sccm
RF output: 50 to 600 W (at 13.56 MHz)
wafer temperature: $-20°$ C. to $80°$ C.

If different equipment is used, machine-specific parameters do not affect the principle of the etching and are in each case simple to optimize. Performing a sufficiently fine tuning good results can also be attained with main parameter settings other than those given above. For example, wafer temperatures lower than $-20°$ C. can then be attained, which affects the process positively, if at all. In order to avoid deposition of molecular iodine on the chamber walls, it is recommended to heat the reactor to at least approximately $60°$ C., similarly to what has already been done before when etching with other halogens.

Another unexpected advantage with etching that is performed according to the invention is the absence of any corrosion whatever. Although in-situ photoresist stripping and rinsing with water were planned for the test, it has been found that even without such post-treatment processes, no visible corrosion occurred on the wafer (as checked by a light-optical microscope). Even after treatment with hot water vapor, no corrosion could be detected. The corrosion free etching permits an extremely flexible use of the etching process according to the invention, since in contrast to previously used processes, it is no longer necessary to employ a post-treatment sequence with strict time coupling. Once again, this is a distinct improvement over the previous processes based on chlorine and bromine etching chemistry.

If, in addition to the anisotropy and the corrosion free etching, it should also be desirable to optimize other properties of the etching process, this can easily be done by admixing a halogen-containing compound, or a simple carbon, nitrogen or oxygen compound, with the etching gas mixture.

Moreover, the etching composition can readily have an inert carrier gas mixed with it, such as a noble gas (He, Ar, Kr, Ne, Xe), or nitrogen or hydrogen. These carrier gases can contribute to the ignition of the etching process and stabilizing the plasma. The admixture of oxygen is also possible although in that case the process window is reduced to a very small range.

As noted in etching using chlorine chemistry, problems arise in terms of the uniformity of the etching of a multilayer metallization layer, because aluminum is also etched at some points of the wafer, while at other points a Ti/TiN barrier has already been removed completely. In the overetching step for removing residues of silicon or copper, the underlying oxide film is thinned to a highly variable extent. Such non-uniformity is due to the non-uniformity of the aluminum layer itself, and above all to the topography (which is stepped, for instance) of the metallization layer. The use of an iodine etching chemistry according to the invention solves that problem as well, since the etching process on the TiN layer is stopped because of the very high selectivity. The Ti layers can subsequently be conveniently removed by means of a very homogeneous second etching step (such as $CF_4/O_2$).

I claim:

1. A method for anisotropic dry etching of metallization layers containing aluminum or aluminum alloys, is integrated semicondcutor circuits, using an etching mask for forming conduction lines, with the improvement which comprises etching with a strictly anisotropically attacking etching gas mixture containing hydrogen iodide, and forming an accurately defined vertical profile of the conduction lines.

2. The method according to claim 1, which comprises performing the etching step with an etching gas mixture containing at least one halogen-containing compound in addition to hydrogen iodide.

3. The method according to claim 1, which comprises performing the etching step with an etching gas mixture additionally containing a substance selected from the group consisting of $N_2O$, $CO$, $CO_2$ and $CH_4$.

4. The method according to claim 1, which comprises performing the etching step with an etching gas mixture containing, in addition to the hydrogen iodide, a carrier gas selected from the group consisting of nitrogen, oxygen, hydrogen and a noble gas.

5. The method according to claim 1, which comprises forming the metallization layers from an aluminum alloy containing at least one material selected from the group consisting of silicon and copper.

6. The method according to claim 1, which comprises etching the metallization layers by plasma-assisted reactive ion etching.

7. The method according to claim 1, which comprises applying a photoresist layer as the etching mask.

8. The method according to claim 1, which comprises applying a hard mask being structured by a photoresist mask, as the etching mask.

9. The method according to claim 1, which comprises applying a hard mask made of a material selected from the group consisting of $SiO_2$ and $Si_3N_4$, being structured by a photoresist mask, as the etching mask.

10. In a method for anisotropic dry etching of metallization layers containing aluminum or aluminum alloys, in integrated semiconductor circuits, using an etching mask for forming conduction lines, the improvement which comprises etching with a strictly anisotropically attacking etching gas mixture containing an iodide compound being volatile under normal conditions, and a substance selected from the group consisting of a simple carbon compound, a simple nitrogen compound and a simple oxygen compound, and forming an accurately defined vertical profile of the conduction lines.

11. The method according to claim 10, which comprises performing the etching step with an etching gas mixture containing hydrogen iodide as the iodine compound.

12. A method for anisotropic dry etching of metallization layers containing aluminum or aluminum alloys, in integrated semiconductor circuits, using an etching mask for forming conduction lines, with the improvement which comprises etching with a strictly anisotropically attacking etching gas mixture containing hydrogen iodide, and forming an accurately defined vertical profile of the conduction lines without sidewall passivation and without corrosion.

13. A method for anisotropic dry etching of metallization layers containing aluminum or aluminum alloys, in integrated semiconductor circuits, using an etching mask for forming conduction lines, the improvement which comprises etching with a strictly anisotropically attacking etching gas mixture containing hydrogen iodide, and forming an accurately defined vertical profile of the conduction lines without sidewall passivation and without corrosion, in the submicron range.

* * * * *